US007471167B2

(12) United States Patent
Kim et al.

(10) Patent No.: US 7,471,167 B2
(45) Date of Patent: Dec. 30, 2008

(54) BALUN

(75) Inventors: Chul-soo Kim, Hwaseong-si (KR); Dal Ahn, Asan-si (KR); Kwi-soo Kim, Asan-si (KR); In-sang Song, Seoul (KR); Yun-kwon Park, Dongducheon-si (KR); Seok-chul Yun, Yongin-si (KR); Kuang-woo Nam, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 189 days.

(21) Appl. No.: 11/638,507

(22) Filed: Dec. 14, 2006

(65) Prior Publication Data

US 2007/0194860 A1 Aug. 23, 2007

(30) Foreign Application Priority Data

Feb. 17, 2006 (KR) ...................... 10-2006-0015586

(51) Int. Cl.
*H01P 5/10* (2006.01)
*H03H 7/42* (2006.01)
*H01P 3/08* (2006.01)

(52) U.S. Cl. ........................................ 333/26; 333/238

(58) Field of Classification Search .................. 333/25, 333/26, 238
See application file for complete search history.

(56) References Cited

U.S. PATENT DOCUMENTS

| | | | | | |
|---|---|---|---|---|---|
| 3,976,959 | A | * | 8/1976 | Gaspari | 333/26 |
| 4,240,052 | A | * | 12/1980 | Hallford et al. | 333/202 |
| 4,755,775 | A | * | 7/1988 | Marczewski et al. | 333/26 |
| 5,304,959 | A | * | 4/1994 | Wisherd et al. | 333/26 |
| 5,594,393 | A | * | 1/1997 | Bischof | 333/26 |
| H1959 | H | * | 5/2001 | Kikel | 342/51 |

* cited by examiner

*Primary Examiner*—Dean O Takaoka
(74) *Attorney, Agent, or Firm*—Sughrue Mion, PLLC

(57) ABSTRACT

A balun capable of a reduced whole size. The balun includes an input line receiving an unbalanced signal, an output line receiving the unbalanced signal from the input line and outputting a balanced signal, and a ground part. The input and output lines are formed on a layer, and the ground part is formed on a different layer from the layer. The ground part includes an opening and is electrically connected to the input line, and a portion of the ground part is removed to form the opening so that a potential difference occurs between first and second output lines. Thus, although a length of the output line is less than ¼ of an input wavelength λ, a difference between phases of first and second output signals can be about 180°. As a result, the whole size of the balun can be reduced.

24 Claims, 10 Drawing Sheets

BALUN

CROSS-REFERENCE TO RELATED APPLICATIONS

This application claims priority from Korean Patent Application No. 10-2006-0015586, filed Feb. 17, 2006, in the Korean Intellectual Property Office, the entire disclosure of which is incorporated herein by reference.

BACKGROUND OF THE INVENTION

1. Field of the Invention

The present invention relates to a balance-to-unbalance (balun), and more particularly, to a balun of which the whole size can be reduced.

2. Description of the Related Art

A balance-to-unbalance (balun) is a circuit converting an unbalanced signal into a balanced signal or a balanced signal into an unbalanced signal.

FIG. 1 is a perspective view of a related art balun, and FIG. 2 is a cross-sectional view taken along line I-I' of FIG. 1. Referring to FIGS. 1 and 2, a related art balun 90 includes a base substrate 10, a ground electrode 20, first and second output lines 30 and 40, first and second conductors 50 and 60, an input line 70, and a dielectric layer 80.

In detail, the ground electrode 20 is provided on a lower surface of the base substrate 10, and the first and second output lines 30 and 40 and the input line 70 are provided on an upper surface of the base substrate 10. The ground electrode 20 covers the entire lower surface of the base substrate 10.

The first and second output lines 30 and 40 are spaced apart from each other and face each other based on a central line crossing the base substrate 10. The first and second output lines 30 and 40 are patterned into a substantially '¬' configuration.

A first output port OP1 is provided at an end of the first output line 30 and outputs a first output signal corresponding to an input signal received from the input line 70. A second output port OP2 is provided at an end of the second output line 40 and outputs a second output signal corresponding to the input signal received from the input line 70. The first and second output ports OP1 and OP2 are adjacent to each other.

The first and second conductors 50 and 60 electrically connect the first and second output lines 30 and 40 to the ground electrode 20.

In other words, the first conductor 50 is interposed between the ground electrode 20 and the first output line 30. Here, a portion of the base substrate 10 is removed to form a first via hole, and the first conductor 50 is formed in the first via hole to electrically connect the ground electrode 20 to the first output line 30. As a result, the first output line 30 is electrically connected to the ground electrode 20.

The second conductor 60 is interposed between the ground electrode 20 and the second output line 40. Here, a portion of the base substrate 10 is removed to form a second via hole, and the second conductor 60 is formed in the second via hole to electrically connect the ground electrode 20 to the second output line 40. As a result, the second output line 40 is electrically connected to the ground electrode 20.

The input line 70 is provided above the first and second output lines 30 and 40. An input port IP is provided at an end of the input line 70 adjacent to the first output line 30 and receives an input signal from an external source.

A dielectric layer 80 is provided on an upper surface of the base substrate 10 on which the first and second output lines 30 and 40 are formed. The dielectric layer 80 is interposed between the first and second output lines 30 and 40 and the input line 70.

If an unbalanced signal is input to the input port IP, the unbalanced signal is input to the first and second output lines 30 and 40, and the first and second output ports OP1 and OP2 convert the unbalanced signal into a balanced signal to output first and second output signals, respectively. Here, the first and second output lines 30 and 40 respectively output the first and second output signals as two half signals into which the input signal is divided.

As described above, an input signal is divided into two half signals, the two half signals are output as first and second output signals, and a difference between phases of the first and second output signals is about 180°. For this purpose, a length of a portion of the input line 70 positioned above the first output line 30 must be about ¼ of an input wavelength λ, and a length of a portion of the input line 70 positioned above the second output line 40 must also be about ¼ of the input wavelength λ. Also, lengths of the first and second output lines 30 and 40 facing the input line 70 must each be about ¼ of the input wavelength λ.

As described above, the lengths of the first and second output lines 30 and 40 facing the input line 70 must each be about ¼ of the input wavelength λ so that the balun 90 receives the unbalanced signal and outputs the balance signal through the first and second output ports OP1 and OP2. As a result, there is a limitation to reducing a whole size of the balun 90.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a balance-to-unbalance (balun), the whole size of which may be reduced.

According to an aspect of the present invention, a balun includes a substrate, first and second signal lines, a ground part, and a first dielectric.

The first signal line may be formed on the substrate and transmit an input signal. The second signal line may be formed on a layer of the substrate on which the first signal line is formed, receive the input signal from the first signal line, and output first and second output signals having different phases. The ground part may be formed on a different layer from the layer on which the first and second signal lines are formed, include an opening, and may be electrically connected to the first signal line, wherein a portion of the ground part is removed to form the opening so that a potential difference occurs between a path of the second signal line through which the first output signal is transmitted and a path of the second signal line through which the second output signal is transmitted. The first dielectric may be interposed between the first and second signal lines and the ground part.

The first signal line may include a first port receiving the input signal from an external source, and a second port opposite to the first port and outputting the input signal received through the first port to the second signal line.

The balun may further include a first conductor electrically connecting the first port to the ground part. Here, the dielectric may include a first via hole, wherein a portion of the dielectric is removed to form the first via hole in an area in which the second port and the ground part overlap with each other. The first conductor may be electrically connected to the first port and the ground part through the first via hole.

The ground part may include: a first metal part positioned in an edge area of the substrate and having a closed-loop shape; a second metal part extending from the first metal part and facing the first and second signal lines; and a third metal part extending from the first metal part, spaced apart from the second metal part in an area facing the first port and an input port, and facing the first signal line.

The second metal part may be electrically connected to the second port through the first conductor.

The second metal part and the third metal part comprise one or more branches which extend from the first metal part.

The ground part comprises: a first ground part electrically connected with the second port via the first conductor; a second ground part formed on the first ground part with a predetermined gap therebetween; and a conductive member electrically connecting the first and the second ground parts, and supporting (one end of) the second ground part whose other end extends above the first ground part by a predetermined gap.

A width of an area of the first signal line in which the first port is formed may be thicker than a width of an other area of the first signal line excluding the first port.

The second signal line may include: the input port positioned adjacent to the second port and receiving the input signal; a first output line extending from the input port, positioned adjacent to the first signal line, and outputting the first output signal; and a second output line extending from the input port in an opposite direction to a direction toward which the first output line extends and outputting the second output signal.

The input port may be positioned in a center of the second signal line, and a length of the first signal may be equal to a sum of lengths of the input port and the first output line.

A difference between phases of the first and second output signals may be about 180°.

The balun may further include at least one capacitor provided above the ground part and electrically connected to the ground part.

The at least one capacitor may include: a first electrode part provided in a first area and a second area above the ground part and electrically connected to the ground part in the second area; and a second electrode part provided above the first electrode part and electrically connected to the ground part in the first area.

The balun may further include: a second dielectric interposed between the ground part and the first electrode part; and a third dielectric interposed between the first and second electrode parts.

The second dielectric may include a second via hole, wherein a portion of the second dielectric is removed to form the second via hole so as to expose a portion of the ground part in the second area. The third dielectric may include a third via hole, wherein a portion of the third dielectric is removed to form the third via hole so as to expose a portion of the ground part in the first area. Thus, the first electrode part may be electrically connected to the ground part through the second via hole, and the second electrode part may be electrically connected to the ground part through the third via hole.

The balun may further include: a second conductor formed in the second via hole to electrically connect the first electrode part to the ground part; and a third conductor formed in the third via hole to electrically connect the second electrode part to the ground part.

An area of the first electrode part corresponding to the third conductor may be removed so that the third conductor penetrates the area, and the first electrode part is insulated from the third conductor.

The capacitor may include: a third electrode part formed in the first and second areas above the ground part; and a fourth electrode part extending from the third electrode part in a direction orthogonal to the third electrode part, positioned in the first area, and connected to the ground part to electrically connect the ground part to the third electrode part. The fourth electrode part may form a single body along with the third electrode part.

The balun may further include a fourth electric interposed between the third electrode part and the ground part.

According to another aspect of the present invention, there is provided a balun including a substrate, first and second signal lines, a ground part, and a dielectric.

The first signal line may include first and second ports and be formed on the substrate to transmit an input signal, wherein the first port is formed at a first end to receive the input signal, and the second port is formed at a second end opposite to the first port to output the input signal received from the first port.

The second signal line may be positioned adjacent to the first signal line on the substrate, cross a center of the substrate, and include an input port and both ends, wherein the input port is formed in an area adjacent to the second port to receive the input signal from the second port, and the both ends output first and second output signals corresponding to the input signal and having different phases.

The ground part may be positioned in an edge area of the substrate and include first, second, and third metal parts, wherein the first metal part has a closed-loop shape, the second metal part extends from the first metal part toward the center of the substrate and faces the first and second signal lines, and the third metal part extends from the first metal part toward the center of the substrate, faces the second signal line, is spaced apart from the second metal part in an area in which the input port and the second port are formed, and is electrically connected to the second port.

The dielectric may be interposed between the first and second signal lines and the ground part.

According to another aspect of the present invention, there is provided a balun including a substrate, first and second signal lines, a ground part, a dielectric, and a capacitor.

The first signal line may include first and second ports and be formed on the substrate to transmit an input signal, wherein the first port is formed at a first end to receive the input signal, and the second port is formed at a second end opposite to the first end to output the input signal received from the first port and.

The second signal line may be positioned adjacent to the first signal line on the substrate, cross a center of the substrate, and include an input port and both ends, wherein the input port is formed in an area adjacent to the second port to receive the input signal from the second port, and the both ends output first and second output signals corresponding to the input signal and having different phases.

The ground part may be positioned in an edge area of the substrate and include first, second, and third metal parts, wherein the first metal part has a closed-loop shape, the second metal part extends from the first metal part toward the center of the substrate and faces the first and second signal lines, and the third metal line extends from the first metal part toward the center of the substrate, faces the second signal line, is spaced from the second metal part in an area in which the input port and the second port are formed, and is electrically connected to the second port.

The dielectric may be interposed between the first and second signal lines and the ground part.

The capacitor may be provided above the ground part and include first and second electrode parts, wherein the first electrode part is electrically connected to the third metal part, and the second electrode part is spaced apart from the first electrode part above the first electrode part and electrically connected to the second metal part.

According to another aspect of the present invention, a balun includes a substrate, first and second signal lines, a ground part, a dielectric, and a capacitor.

The first signal line may include first and second ports and be formed on the substrate to transmit an input signal, wherein the first port is formed at a first end to receive the input signal, and the second port is formed at a second end opposite to the first end to output the input signal received from the first port.

The second signal line may be positioned adjacent to the first signal line on the substrate, cross a center of the substrate, and include an input port and both ends, wherein the input port is formed in an area adjacent to the second port to receive the input signal from the second port, and the both ends output first and second output signals corresponding to the input signal and having different phases.

The ground part may be positioned in an edge area of the substrate and include first, second, and third metal parts, wherein the first metal part has a closed-loop shape, the second metal part extends from the first metal part toward the center of the substrate and faces the first and second signal lines, and the third metal part extends from the first metal part toward the center of the substrate, faces the second signal line, is spaced from the second metal part in an area in which the input port and the second port are formed, and is electrically connected to the second port.

The dielectric may be interposed between the first and second signal lines and the ground part.

The capacitor may be provided above the ground part and include third and fourth electrode parts, wherein the third electrode part is spaced apart from the third metal part, and the fourth electrode part extends from the third electrode part and is connected to the second metal part to electrically connect the second metal port to the third electrode part.

In a balun according to the present invention, a ground part may be patterned so that a potential difference occurs between first and second output signals. Although a length of an output line is less than ¼ of an input wavelength λ, a difference between phases of the first and second output signals can be about 180°. As a result, a whole size of the balun can be reduced.

BRIEF DESCRIPTION OF THE DRAWINGS

The above and other aspects of the present invention will be more apparent by describing certain exemplary embodiments of the present invention with reference to the accompanying drawings, in which.

DETAILED DESCRIPTION OF EXEMPLARY EMBODIMENTS

Figure 1:
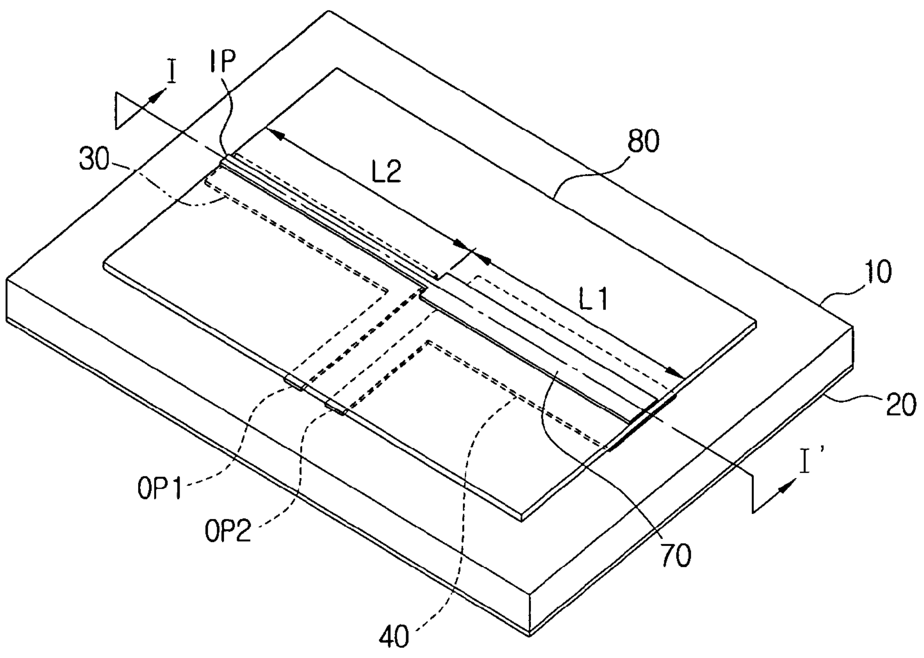
FIG. 1 (RELATED ART)
FIG. 1 is a perspective view of a related art a balance-to-unbalance (balun)
Figure 2:
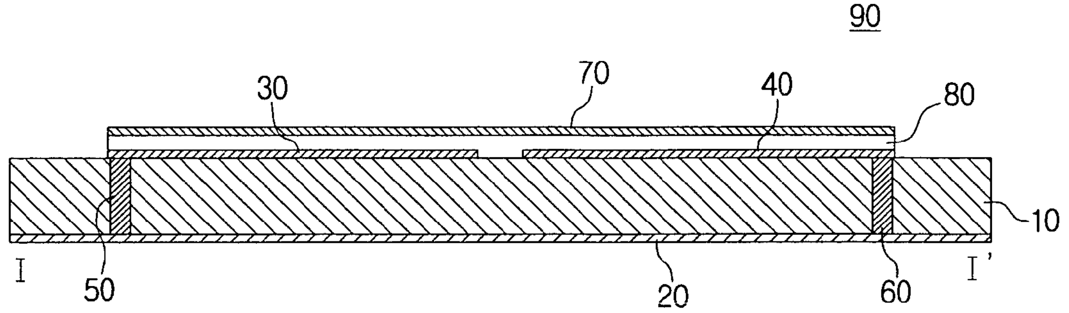
FIG. 2 (RELATED ART)
FIG. 2 is a cross-sectional view taken along line I-I' of FIG. 1.

Reference will now be made in detail to exemplary embodiments of the present invention, examples of which are illustrated in the accompanying drawings, wherein like reference numerals refer to the like elements throughout. The exemplary embodiments are described below in order to explain the present invention by referring to the figures.

The matters defined in the description such as the detailed construction and elements are provided to assist in a comprehensive understanding of the invention. Thus, it would be apparent to one skilled in the art that the present invention can be practiced out without those defined matters. Also, well-known functions or constructions are not described in detail since they would obscure the invention with unnecessary detail.

Figure 3:
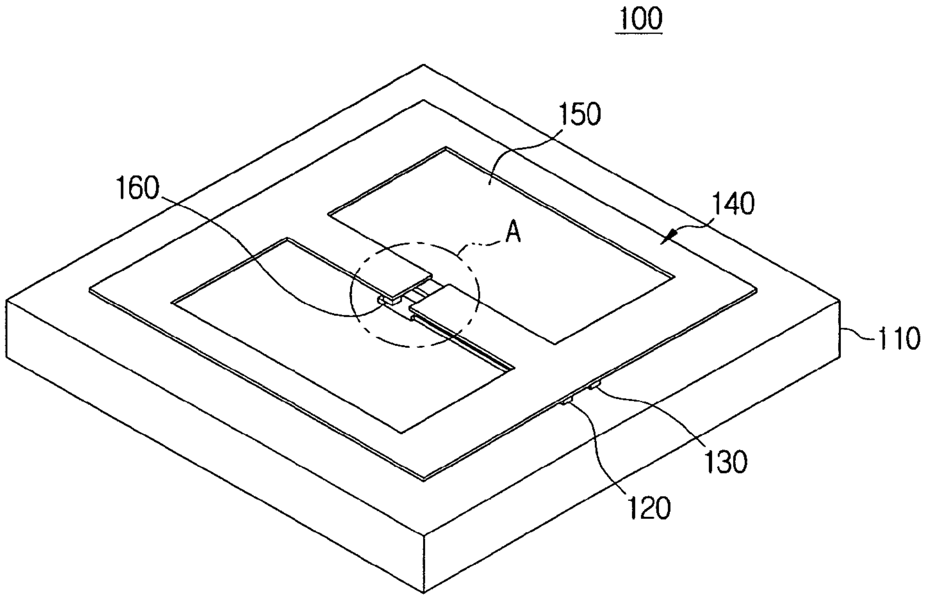
FIG. 3 is a perspective view of a balun according to a first exemplary embodiment of the present invention.
Figure 4:
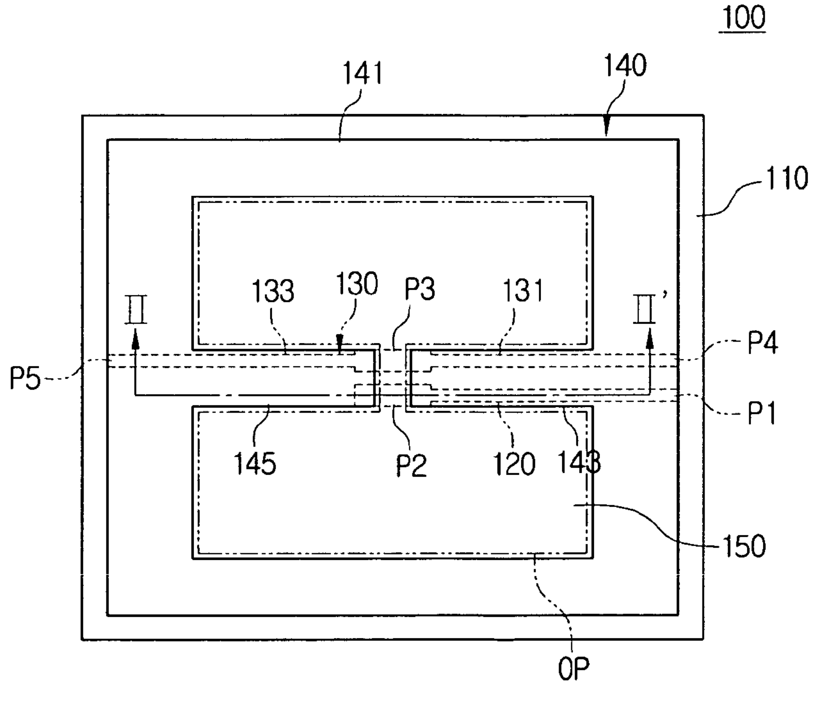
FIG. 4 is a plan view of the balun shown in FIG. 3.

FIG. 3 is a perspective vive of a balun according to an exemplary embodiment of the present invention, and FIG. 4 is a plane view of the balun shown in FIG. 3. Referring to FIGS. 3 and 4, a balun 100 includes a base substrate 110, an input line 120, an output line 130, a ground part 140, and a first dielectric layer 150.

In detail, the base substrate 110 is formed of an insulating material such as silicon or the like.

The input line 120 is provided on the base substrate 110. The input line 120 crosses a center of the base substrate 110, receives an input signal from an external source, and provides the input signal to the output line 130. A first port P1 is provided at a first end of the input line 120, and a second port P2 is provided at a second end of the input line 120 opposite to the first end.

The first port P1 receives the input signal from the external source, while the second port P2 outputs the input signal to the output line 130. Here, a width of the second port P2 is wider than a width of an other area of the input line 120.

The output line 130 is provided on the base substrate 110 and spaced apart from the input line 120. The output line 130 includes an input port P3 adjacent to the second port P2 of the input line 120. The output line 130 also includes first and second output lines 131 and 133 positioned beside both sides of the input port P3.

The input port P3 is positioned in a center of the output line 130 and has a wider width than widths of the first and second output lines 131 and 133. The input port P3 receives the input signal from the second port P2 and provides the input signal to the first and second output lines 131 and 133.

The first output line 131 is positioned adjacent to the input line 120 and extends from the input port P3 toward a longitudinal direction of the input line 120. The first output line 131 is disposed parallel with the input line 120 at a predetermined distance from the input line 120. A first output port P4 is provided at an end of the first output line 131. The first output port P4 is positioned adjacent to the first port P1 and outputs a first output signal corresponding to the input signal.

The second output line 133 extends from the input port P3 and faces the first output line 131 based on the input port P3. A second output port P5 is provided at an end of the second output line 133. The second output port P5 outputs a second output signal corresponding to the input signal.

A process of outputting the first and second output signals will now be described. The input signal input from the first port P1 is transmitted along the input line 120 and output through the second port P2. The input signal output from the second port P2 is input to the input port P3 through a space formed between the second port P2 and the input port P3 of the output line 130. Here, a difference between phases of the first and second output signals is about 180°. Thus, the first and second output lines 131 and 133 divide the input signal received from the input port P3 into two half signals to output the first and second output signals.

Figure 5:
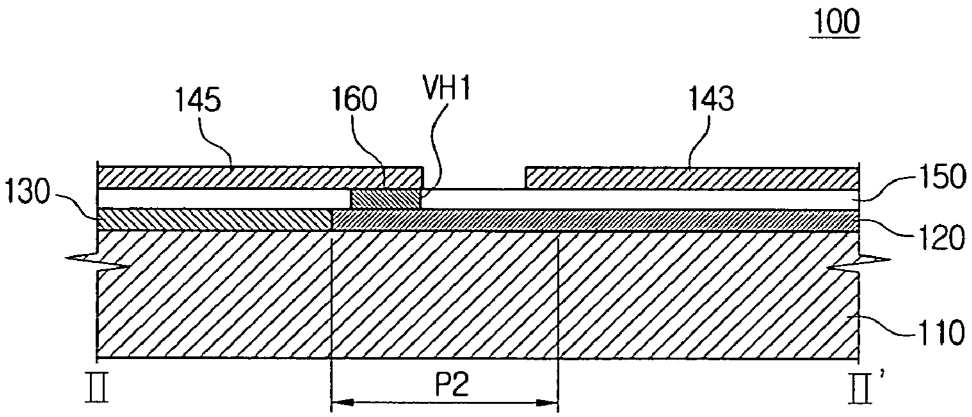
FIG. 5 is a cross-sectional view taken along line II-II' of FIG. 4.

FIG. 5 is a cross-sectional view taken along line II-II' of FIG. 4.

Referring to FIGS. 4 and 5, the ground part 140 is provided above the input and output lines 120 and 130. The ground part 140 may include a first pattern which is electrically connected with the input line 120, and a second pattern OP which is formed by removing a part of the first pattern. The second pattern may be considered an opening.

The first pattern of the ground part 140 includes a first metal part 141 formed in an edge area of the base substrate 110, a second metal part 143 extending from the first metal part 141, and a third metal part 145 extending from the first metal part 141.

The first metal part 141 is formed in a closed-loop shape.

The second metal part 143 extends from the first metal part 141 toward the center of the base substrate 110. The second metal part 143 is positioned above the input line 120 and the first output line 131.

The third metal part 145 extends from the first metal part 141 toward the center of the base substrate 110 and is positioned above the second output line 133.

Figure 6:
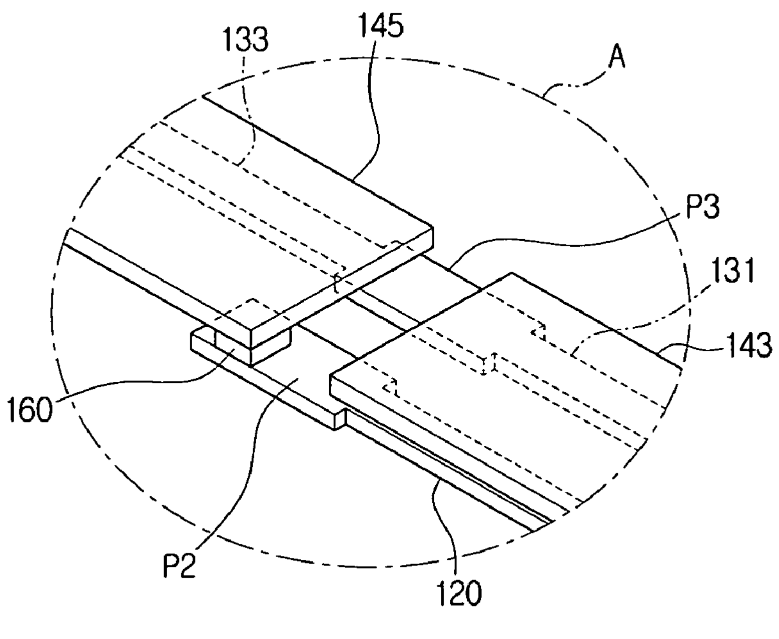
FIG. 6 is an enlarged perspective view of part A shown in FIG. 3.

FIG. 6 is an enlarged perspective view of part A shown in FIG. 3.

Referring to FIGS. 4 and 6, the third metal part 145 faces the second metal part 143 at a predetermined distance from the second metal part 143. This allows a potential difference to occur between the second and third metal parts 143 and 145. Thus, a phase difference occurs between the first and second output ports P4 and P5. As a result, the input signal is divided into the two half signals and input to the first and second output lines 131 and 133.

The second port P2 and the input port P3 are partly exposed through a space between the second and third metal parts 143 and 145. An end of the third metal part 145 is electrically connected to the second port P2, and thus the ground part 140 is electrically connected to the input line 120. Here, although the ground part 140 is electrically connected to the input line 120, the input signal is not inducted to the ground part 140 due to the insulation between the second and third metal parts 143 and 145. A distance between the second and third metal parts 143 and 145 determines a capacitance value of the balun 100.

The second pattern OP is defined by the first, second, and third metal parts 141, 143, and 145, and the size of the second pattern OP determines the inductance of the balun 100.

In the present embodiment, the second pattern OP has an "I" shape but may have one of various shapes such as a dumbbell shape or a spiral shape according to the shapes of the first, second, and third metal parts 141, 143, and 145.

Referring back to FIGS. 4 and 5, a first dielectric layer 150 is formed on the base substrate 100 on which the input line 120 and the output line 130 are formed. The first dielectric layer 150 is interposed between the input and output lines 120 and 130 and the ground part 140. The first dielectric layer 150 is formed of an insulating material such as aluminum nitride (AlN) or silicon dioxide ($SiO_2$).

The balun 100 further includes a first conductor 160 electrically connecting the input line 120 to the ground part 140.

As shown in FIG. 6, the first conductor 160 is interposed between the second port P2 and the third metal part 145 to electrically connect the second port P2 to the third metal part 145. Here, a portion of the first dielectric layer 150 is removed to form a first via hole VH1 so as to expose a portion of the second port P2, and the first conductor 160 is formed in the first via hole VH1.

Since the second port P2 and the third metal part 145 are shorted by the first conductor 160, the input signal input to the input line 120 is not output to the first port P1 but input to the output line 130 through the second port P2.

As described above, in the balun 100 according to the present embodiment, the input and output lines 120 and 130 are provided on the same layer. Also, the ground part 140 formed above the input and output lines 120 and 130 is patterned in a predetermined shape so that a potential difference occurs between the first and second output lines 131 and 133. Thus, the output line 130 outputs the first and second output signals through the first and second ports P4 and P5, respectively, so that the difference between the phases of the first and second output signals is about 180°. As a result, although lengths of the first and second output lines 131 and 133 are each shorter than ¼ of the input wavelength λ, the first and second output lines 131 and 133 may output the first and second output signals into which the input signal is equally divided. Therefore, a whole size of the balun 100 can be reduced.

Figure 7:
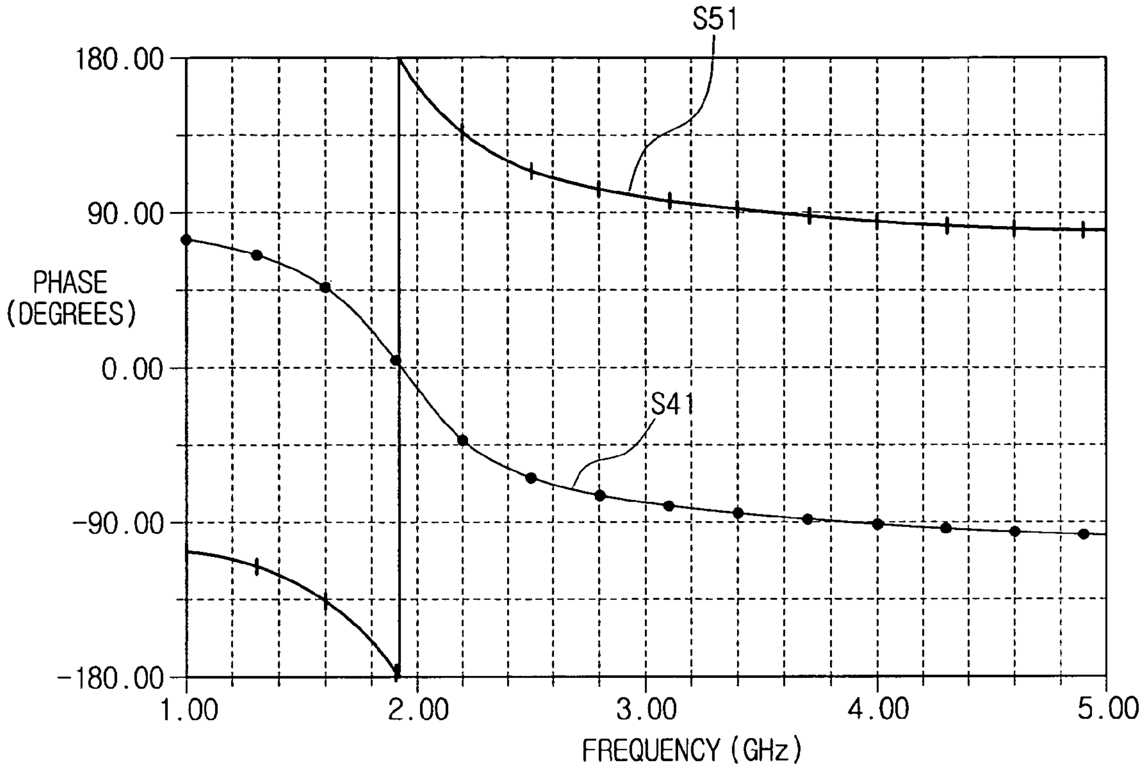
FIG. 7 is a graphical representation of phases of output signals output from first and second output ports shown in FIG. 4.
Figure 8:
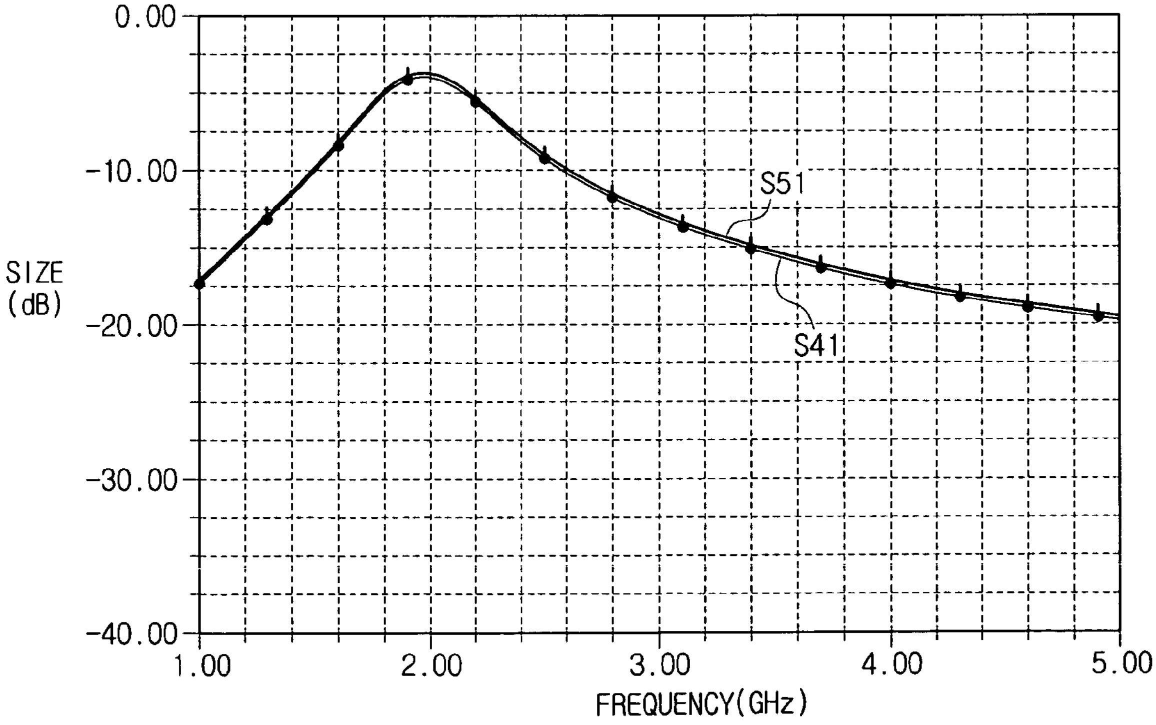
FIG. 8 is a graphical representation of magnitudes of the output signals output from the first and second output ports shown in FIG. 4.

FIG. 7 is a graphical representation of phases of output signals respectively output from the first and second output ports P4 and P5 shown in FIG. 4, and FIG. 8 is a graphical representation of magnitudes of the output signals respectively output from the first and second output ports P4 and P5 shown in FIG. 4

Referring to FIGS. 4, 7, and 8, a first output signal S41 is input from the first port P1 and output through the first output port P4, and a second output signal S51 is input from the first port P1 and output through the second output port P5.

When a frequency is about 2 GHz, a phase of the first output signal S41 is about 0°, a phase of the second output signal S51 is about 180°, and magnitudes of the first and second output signals S41 and S51 are each about −3 dB. In other words, a difference between the phases of the first and second output signals S41 and S51 is about 180°, half of the input signal is output as the first output signal S41, and the other half of the input signal is output as the second output signal S51.

As described above, the balun 100 converts the input signal as an unbalanced signal into the first and second output signals S41 and S51 as a balanced signal and outputs the first and second output signals S41 and S51.

Figure 9:
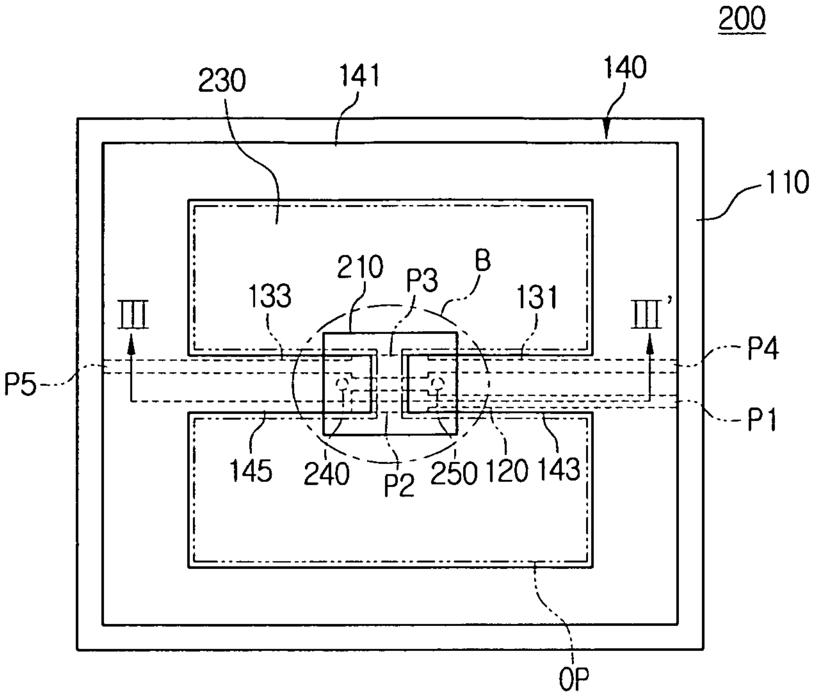
FIG. 9 is a plan view of a balun according to a second exemplary embodiment of the present invention.
Figure 10:
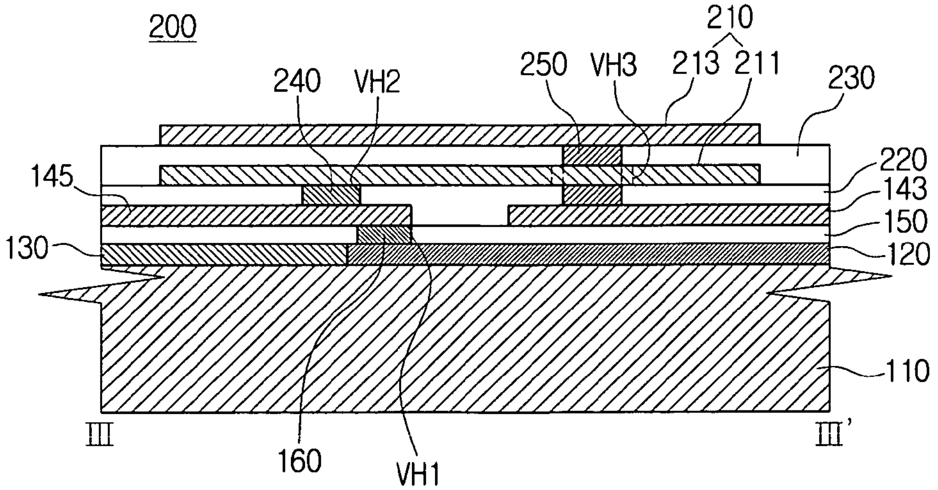
FIG. 10 is a cross-sectional view taken along line III-III' of FIG. 9.

FIG. 9 is a plan view of a balun according to another embodiment of the present invention, and FIG. 10 is a cross-sectional view taken along line III-III' of FIG. 9.

Referring to FIGS. 9 and 10, a balun 200 according to the present embodiment has the same structure as the balun 100 of FIG. 3 excluding a capacitor 210, a second dielectric layer 220, a second dielectric layer 230, a second conductor 240, and a third conductor 250. Thus, the same reference numerals of the balun 200 as those of the balun 100 denote like elements, and thus their detailed descriptions will be omitted.

The balun 200 includes a base substrate 110, an input line 120, an output line 130, a ground part 140, first, second, and third dielectric layers 150, 220, and 230, the capacitor 210, and first, second, and third conductors 160, 240, and 250.

In detail, the input and output lines 120 and 130 are formed on the base substrate 110. The input line 120 receives an input signal from an external source and transmits the input signal to the output line 130, and the output line 130 outputs first and second output signals corresponding to the input signal.

The first dielectric layer 150 is formed on the base substrate 110 on which the input line 120 and the output line 130 are formed, and the ground part 140 is formed on the first dielectric layer 150. A portion of the first dielectric layer 150 is removed to form a first via hole VH1, and the first conductor 160 is formed in the first via hole VH1. The first conductor 160 is interposed between the input line 120 and the ground part 140 to electrically connect the input line 120 to the ground part 140.

A structure of the capacitor 210 will now be described in detail with reference to FIG. 11.

Figure 11:
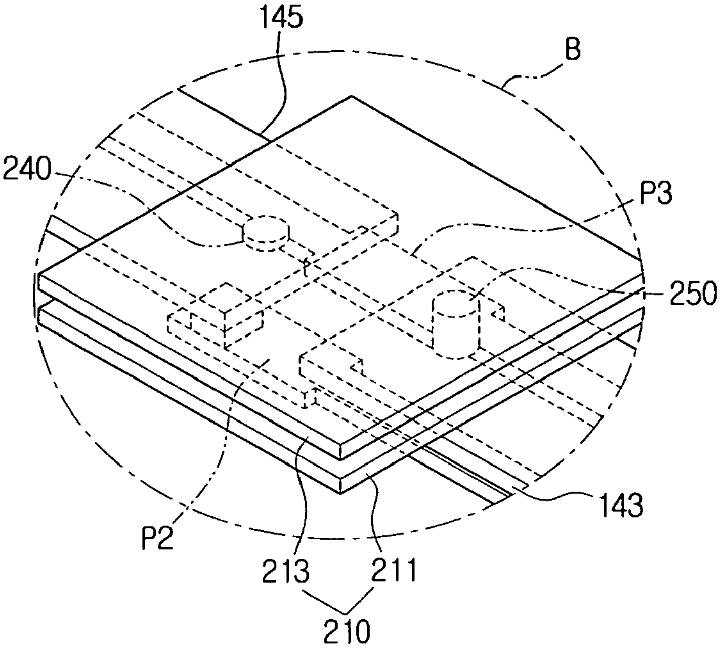
FIG. 11 is an enlarged perspective view of part B shown in FIG. 9.

FIG. 11 is an enlarged perspective view of part B shown in FIG. 9. Referring to FIGS. 10 and 11, the capacitor 210 is formed above the ground part 140. The capacitor 210 is positioned in a center of the base substrate 110 and electrically connected to the ground part 140.

The capacitor 210 includes a first electrode part 211 positioned above the second and third metal parts 143 and 145 and a second electrode part 213 positioned above the first electrode part 211.

The second dielectric layer 220 is formed between the ground part 140 and the first electrode part 211, and the third dielectric layer 230 is formed between the first and second electrode parts 211 and 213. Here, the first, second, and third dielectric layers 150, 220, and 230 are deposited above an entire area of the base substrate 110 using an insulating material such as aluminum nitride (AlN) or silicon dioxide ($SiO_2$).

A portion of the second dielectric layer 220 is removed to form a second via hole VH2 so as to expose a portion of the third metal part 145. The second conductor 240 is formed in the second via hole VH2. The second conductor 240 electrically connects the third metal part 145 to the first electrode part 211.

Portions of the first electrode part 211 and the second and third dielectric layers 220 and 230 are removed to form a third via hole VH3 so as to expose a portion f the second metal part 143. The third conductor 250 is formed in the third vial hole VH3. The third conductor 250 electrically connects the second metal part 143 to the second electrode part 213. Here, a width of the third via hole VH3 formed in the first electrode 211 is wider than a width of the third conductor 250. Thus, the first electrode part 211 does not contact the third conductor 250 and thus is insulated from the third conductor 250.

A capacitance value of the capacitor 210 depends on sizes of the first and second electrode parts 211 and 213, which determines a capacitance value of the balun 200. In other words, the capacitance value of the capacitor 210, and thus the balun 200, increases with increases in the sizes of the first and second electrode parts 211 and 213.

When the capacitance value of the balun 200 increases, a resonance frequency decreases. Thus, a whole size of the balun 200 can be reduced.

A mean frequency of the balun 200 can be adjusted to the capacitance value. Thus, a magnitude of the capacitor 210 can be adjusted to adjust the mean frequency or the whole size of the balun 200.

Figure 12:
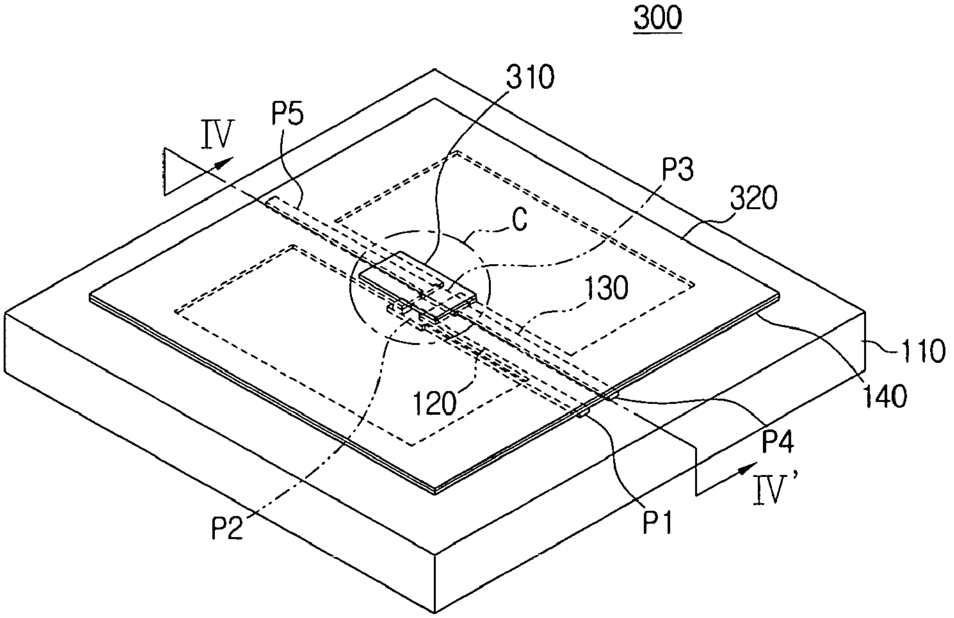
FIG. 12 is a perspective view of a balun according to a third exemplary embodiment of the present invention.
Figure 13:
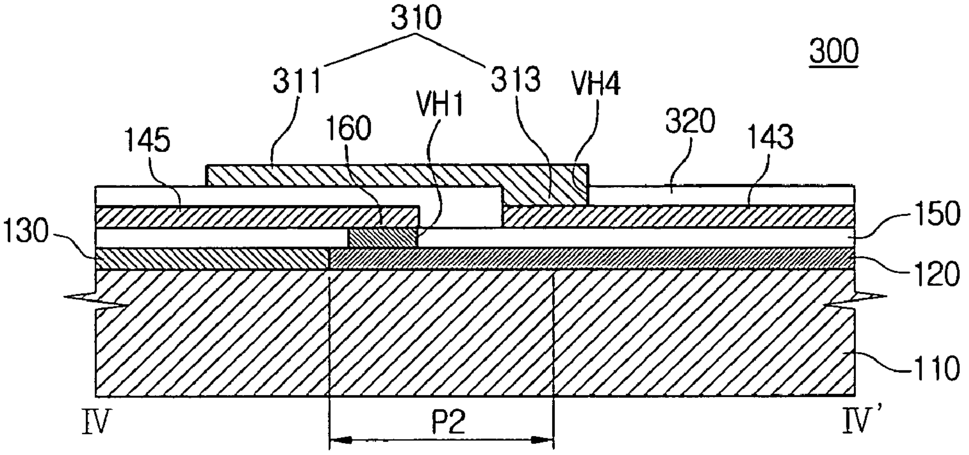
FIG. 13 is a cross-sectional view taken along line IV-IV' of FIG. 12.

FIG. 12 is a perspective view of a balun according to another exemplary embodiment of the present invention, and FIG. 13 is a cross-sectional view taken along line IV-IV' of FIG. 12. Referring to FIGS. 12 and 13, a balun 300 according to the present embodiment has the same structure as the balun 100 of FIG. 3 excluding a capacitor 310 and a fourth dielectric layer 320. Thus, the same reference numerals of the balun 300 as those of the balun 100 of FIG. 3 denote like elements, and thus their detailed descriptions will be omitted.

The balun 300 includes a base substrate 110, an input line 120, an output line 130, a ground part 140, first and fourth dielectric layers 150 and 320, a first conductor 160, and the capacitor 310.

In detail, the input and output lines 120 and 130 are formed on the base substrate 110. The input line 120 receives an input signal from an external source and provides the input signal to the output line 130, and the output line 130 outputs first and second output signals corresponding to the input signal.

The first dielectric layer 150 is formed on the base substrate 110 on which the input and output lines 120 and 130 are formed, and the ground part 140 is formed on the first dielectric layer 150. A portion of the first dielectric layer 150 is removed to form a first via hole VH1, and the first conductor 160 is formed in the first via hole VH1. The first conductor 160 is interposed between the input line 120 and the ground part 140 to electrically connect the input line 120 to the ground part 140.

Figure 14:
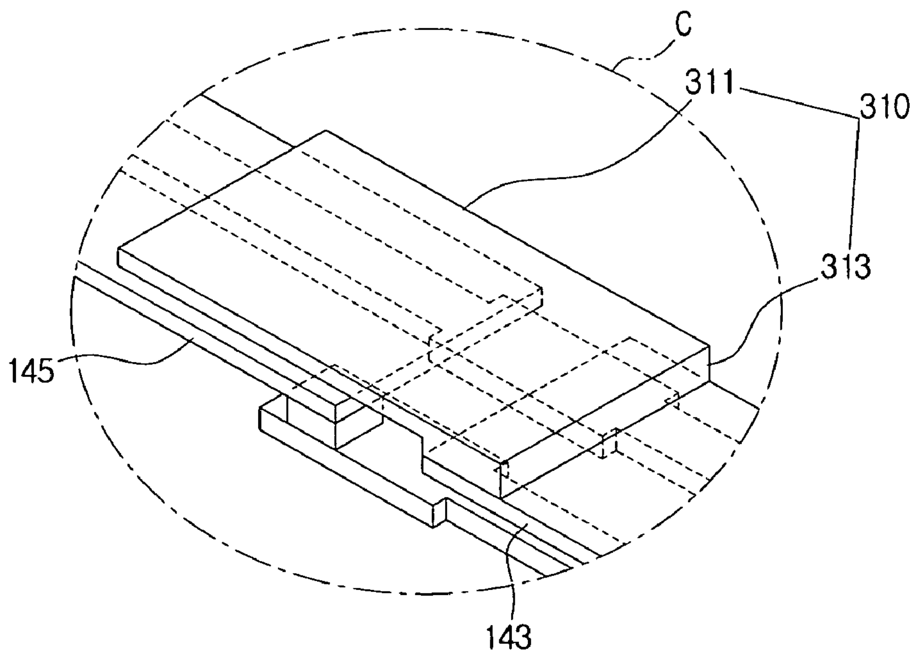
FIG. 14 is an enlarged perspective view of part C of FIG. 12.

A structure of the capacitor 310 will now be described in detail with reference to FIG. 14. FIG. 14 is an enlarged perspective view of part C of FIG. 12.

Referring to FIGS. 13 and 14, the capacitor 310 is formed on the ground part 140. The capacitor 310 includes a third electrode part 311 positioned above a third metal part 145 and a fourth electrode part 313 electrically connecting the third electrode part 311 to a second metal part 143. The fourth electrode part 313 extends from the third electrode part 311 and is connected to the second metal part 143.

The fourth dielectric layer 320 is formed between the ground part 140 and the third electrode part 311. A portion of the fourth dielectric layer 320 is removed to form a fourth via hole VH4 so as to expose an end of the second metal part 143. The fourth electrode part 313 is formed in the fourth via hole VH4 to be electrically connected to the second metal part 143. Thus, a capacitance is formed between the third metal part 145 and the third electrode part 311. The capacitance value of the capacitor 310 depends on the size of the third electrode part 311. In other words, the capacitance increases, subsequently increasing the capacitance of the balun 300, as the size of the third electrode part 311 is larger.

Because the resonance frequency deceases when the capacitance of the balun 300 increases, the overall size can be reduced.

As explained above, the mean frequency can be adjusted in accordance with the capacitance in the balun 300, that is, the size of mean frequency, or the overall size, can be adjusted by adjusting the size of the capacitor 310.

Figure 15:
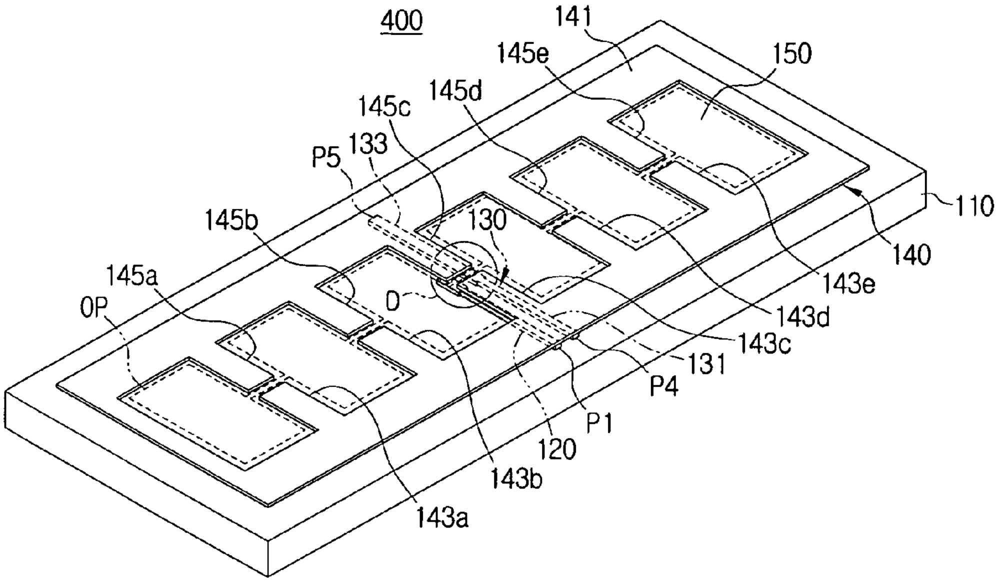
FIG. 15 is a perspective view of a balun according to a fourth exemplary embodiment of the present invention.
Figure 16:
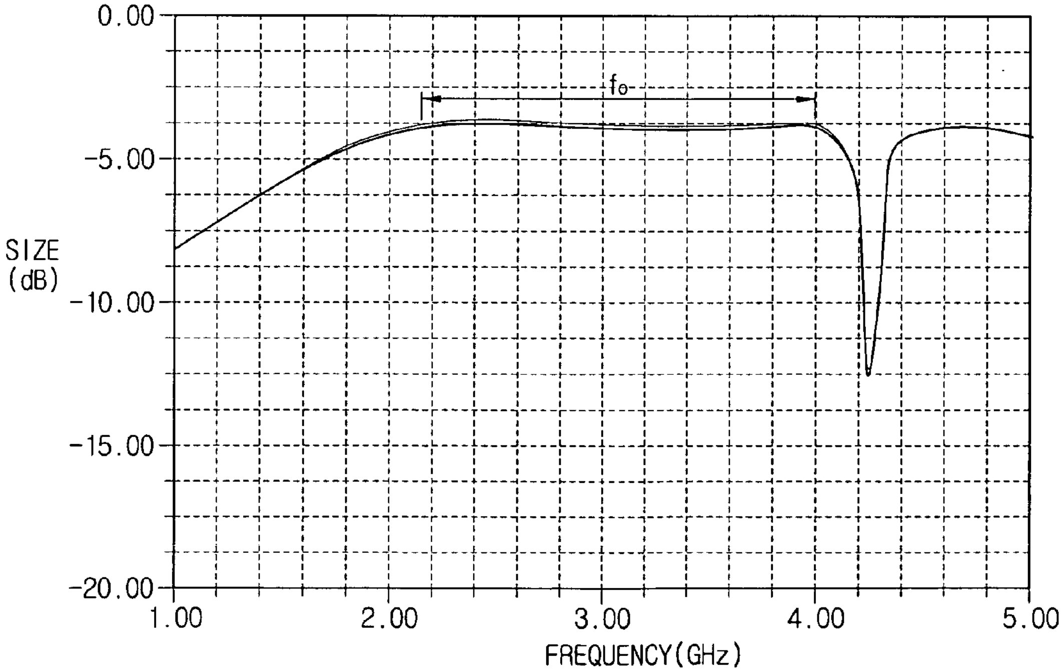
FIG. 16 is a graphical representation of magnitudes of the output signals output from the output ports of FIG. 15.

FIG. 15 is a perspective view of a balun according to a fourth exemplary embodiment of the present invention, and FIG. 16 is a graphical representation of magnitudes of the output signals output from the output ports of FIG. 15.

Referring to FIG. 15, the balun 400 according to the fourth exemplary embodiment has almost the same structure as that of the balun 100 shown in FIG. 3, except for the ground part 140. Therefore, the like elements with the same functions will be referred to by the same reference numerals or symbols and detailed explanations will be omitted for the sake of brevity.

The balun 400 may include a base substrate 110, an input line 120, an output line 130, a ground part 140 and a first dielectric layer 150.

More specifically, the input line 120 and the output line 130 are formed on the base substrate 110. The input line 120 receives an external signal and provides the output line 130 with the signal, and the output line 130 outputs first and second output signals corresponding to the input signal.

The first dielectric layer 150 is formed on the base substrate 110 having the input line 120 and the output line 130 formed thereon, and the ground part 140 is formed on the first dielectric layer 150. The dielectric layer 150 is partly removed to form a first via hole VH1, and there is a first conductor 160 formed in the first via hole VH1. The first conductor 160, interposed between the input line 120 and the ground part 140, electrically connect the input line 120 and the ground part 140.

The ground part 140 may include a first pattern which is electrically connected with the input line 120, and a second pattern formed by removing a part of the first pattern. The first pattern of the ground part 140 includes a first metal part 141 formed in an edge area of the base substrate 110, a second metal part 143 having one or more branches 143*a*, 143*b*, 143*c*, 143*d*, 143*e* extended from the first metal part 141, and a third metal part 145 having one or ore branches 145*a*, 145*b*, 145*c*, 145*d*, 145*e* extended from the first metal part 141.

The first metal part 141 is formed in a closed-loop shape.

The branches 143*a*, 143*b*, 143*c*, 143*d*, 143*e* of the second metal part 143 extend from the first metal part 141 toward the center of the base substrate 110.

The branches 145*a*, 145*b*, 145*c*, 145*d*, 145*e* of the third metal part 145 extend from the first metal part 141 toward the center of the base substrate 110 and face the branches 143*a*, 143*b*, 143*c*, 143*d*, 143*e* of the second metal part 143.

More specifically, the branches 145*a*, 145*b*, 145*c*, 145*d*, 145*e* of the third metal part 145 each face the branches 143*a*, 143*b*, 143*c*, 143*d*, 143*e* of the second metal part 143, and are at a predetermined distance away from the branches 143*a*, 143*b*, 143*c*, 143*d*, 143*e* of the second metal part 143. For example, the first branch 145*a* of the third metal part 145 faces the first branch 143*a* of the second metal part 143 at a predetermined distance.

Certain branches of the second and the third metal parts 143, 145, for example, the second branches 143*c*, 145*c* may be formed above the input line 120, the first output line 131 and the second output line 133. Potential difference is generated between the branches 143*a*, 143*b*, 143*c*, 143*d*, 143*e* of the second metal part 143 and the branches 145*a*, 145*b*, 145*c*, 145*d*, 145*e* of the third metal part 145, which subsequently cause a phase difference between the first output port P4 and the second output port P5. As a result, the input signal is divided into halves and inputted to the first and the second output lines 131, 133, respectively.

Encircled area 'D' of FIG. 15 is substantially identical to encircled area 'A' of FIG. 3. Referring to FIGS. 6 and 15 which show area 'A' in enlargement, the second port P2 and the input port P3 are partly exposed through a space between the second and the third metal parts 143, 145. An end of the third metal part 145 is electrically connected with the second port P2 via the first conductor 160, and accordingly, the ground part 140 is electrically connected with the input line 120. However, because the second metal part 143 and the third metal part 145 are spaced away from each other, all the input signal is not induced to the ground part 140. The distance between the second metal part 143 and the third metal part 145 determines the capacitance of the balun 400.

The second pattern OP is defined by the first to third metal parts 141, 143, 145, and the size of the second pattern OP determines the inductance of the balun 100.

In the present embodiment, the second pattern OP has an "I" shape but may have one of various shapes such as a dumbbell shape or a spiral shape according to the shapes of the first, second, and third metal parts 141, 143, and 145.

In one aspect of the present invention, the ground part 140 includes a plurality of ground parts 140 of FIG. 3 and thus has the second pattern OP of an increased size. Because the second pattern OP is formed in the increased size, the balun 400 has an increased inductance.

According to the present exemplary embodiment, the capacitance may be increased by adjusting the distance between the branches of the second and the third metal parts 143, 145, and because the resonance frequency is also decreased, the overall size can be reduced. Furthermore, because the inductance of the balun 400 can be increased by increasing the size of the second pattern OP of the ground part 140, wide bandwidth, which has the operating frequency band $f_o$ reaching 1.9 GHz as shown in FIG. 16, can be provided. As a result, the size of the balun 140 can be reduced, and at the same time, the wideband matching is enabled.

Figure 17:
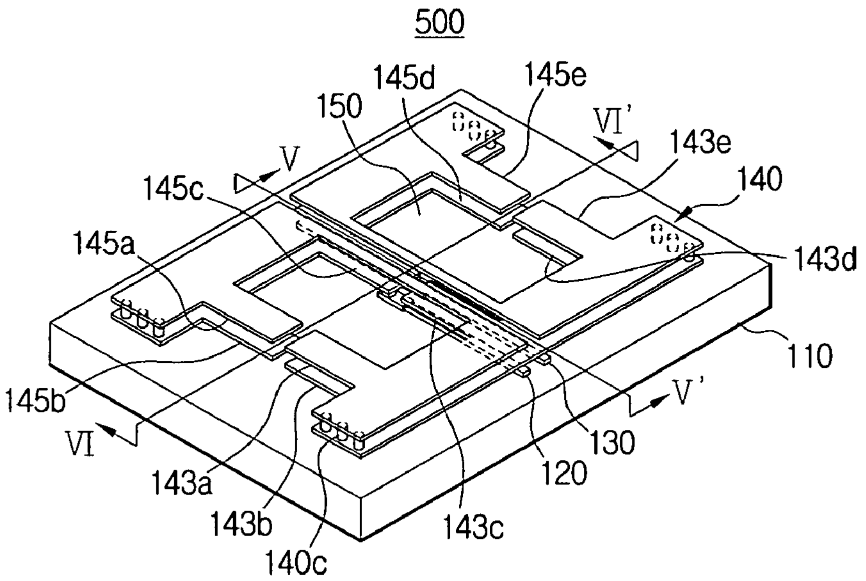
FIG. 17 is a perspective view of a balun according to a fifth exemplary embodiment of the present invention.
Figure 18:
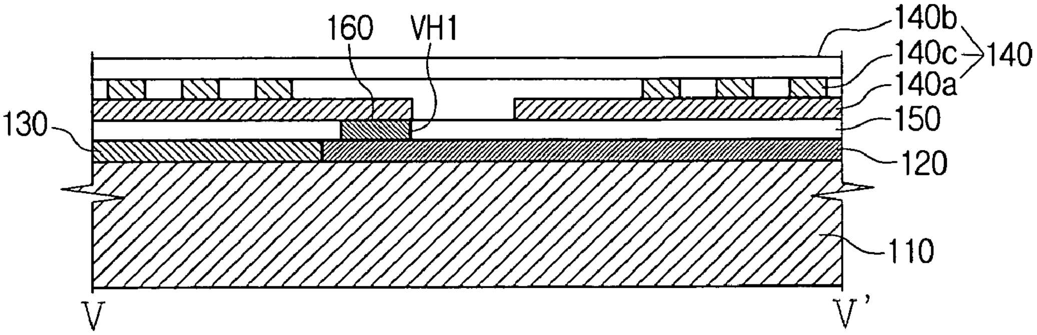
FIG. 18 is a sectional view taken on line V-V' of FIG. 17.
Figure 19:
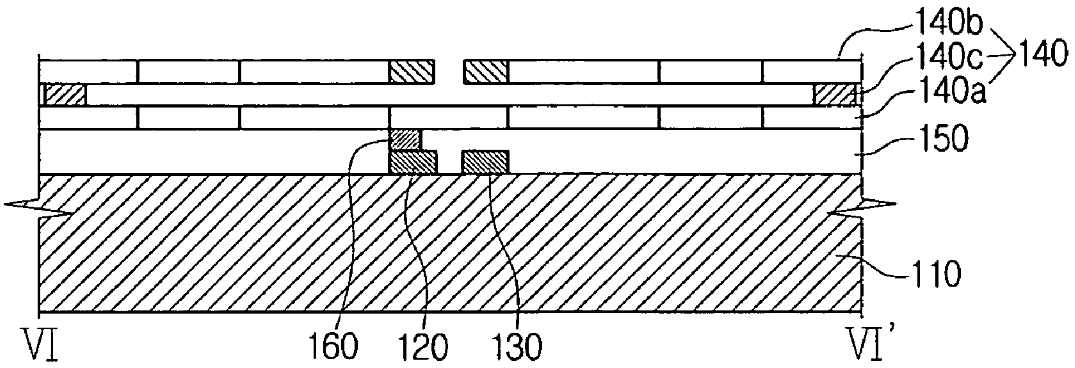
FIG. 19 is a sectional view taken on line VI-VI' of FIG. 17.

FIG. 17 is a perspective view of a balun according to a fifth exemplary embodiment of the present invention, FIG. 18 is a sectional view taken on line V-V' of FIG. 17, and FIG. 19 is a sectional view taken on line VI-VI' of FIG. 17.

Referring to FIGS. 17 to 19, the balun 500 according to the fifth exemplary embodiment has almost the same structure as that of the balun 100 of FIG. 3, except for the ground part 140. Therefore, the like elements with the same functions will be referred to by the same reference numerals or symbols and detailed explanations will be omitted for the sake of brevity.

The balun 500 may include a base substrate 10, an input line 120, an output line 130, a ground part 140 and a first dielectric layer 150.

More specifically, the input line 120 and the output line 130 are formed on the base substrate 110. The input line 120 receives an external signal and provides the output line 130 with the signal, and the output line 130 outputs first and second output signals corresponding to the input signal.

The first dielectric layer 150 is formed on the base substrate 110 having the input line 120 and the output line 130 formed thereon, and the ground part 140 is formed on the first dielectric layer 150. The dielectric layer 150 is partly removed to form a first via hole VH1, and there is a first conductor 160 formed in the first via hole VH1. The first conductor 160, interposed between the input line 120 and the ground part 140, electrically connect the input line 120 and the ground part 140.

The ground part 140 may include a first ground part 140*a*, a second ground part 140*b* and a fourth conductor 140*c*. The first ground part 140*a* is electrically connected with the input line 120 via the first conductor 160. The second ground part 140*b* is formed on the first ground part 140*a* at a predetermined distance. The fourth conductor 140*c* electrically connects the first and the second ground parts 140*a*, 140*b*, and at the same time, supports one end of the second ground part 140*b* whose other end extends over the first ground part 140*a*.

The first and the second ground parts 140*a*, 140*b* have substantially the same configuration as the ground part 140 exemplified in FIG. 15. Accordingly, the first and the second ground parts 140*a*, 140*b* include a first pattern having first to third metal parts 141, 143, 145, and a second pattern OP defined by the first pattern, in which the second and the third metal parts 143, 145 include branches 143*a*, 143*b*, 143*c*, 143*d*, 143*e* and 145*a*, 145*b*, 145*c*, 145*d*, 145*e* extending from the first metal part 141 toward the center of the base substrate 110.

Referring to FIG. 17, the second to fourth branches 143*b*, 143*c*, 143*d* of the second metal part 143, and the second to fourth branches 145*b*, 145*c*, 145*d* of the third metal part 145 may be formed on the first ground part 140*a*, and the first and the fifth branches 143*a*, 143*e* of the second metal part 143, and the first and the fifth branches 145*a*, 145*e* of the third metal part 145 may be formed on the second ground part 140*b*.

If the ground part 140 is structured according to the above, the second pattern OP of the ground part 140 may have substantially the same size as the second pattern of the ground part 140 of FIG. 15. Accordingly, the size of the second pattern OP increases by the use of a plurality of the ground part 140 of the balun 100 of FIG. 3, and the inductance of the balun 500 increases.

Therefore, according to this exemplary embodiment of the present invention, capacitance of the balun 500 can be increased by appropriately adjusting the distances between the branches 143*a*, 143*b*, 143*c*, 143*d*, 143*e* and 145*a*, 145*b*, 145*c*, 145*d*, 145*e* of the second and the third metal parts 143, 145, and because the resonance frequency is decreased, the overall size can be reduced. Furthermore, by increasing the size of the second pattern OP of the round part 140 and thus increasing the inductance, a wide bandwidth whose operating frequency reaching 1.9 GHz (FIG. 16) can be provided.

More specifically, while this exemplary embodiment can provide the matching in substantially the same frequency range as that shown in FIG. 16 because the ground part 140 has a second pattern which has substantially the same size and inductance as the ground part 140 of the balun 400 shown in FIG. 15, the balun 400 of this embodiment can have a reduced size because the size of the ground part 140 is not increased to increase the size of the second pattern.

Additionally, the balun can be made to variably form the inductance without a change in size, and the size of the balun having the same operating frequency can be reduced.

As described above, in a balun according to an exemplary embodiment of the present invention, input and output lines can be formed on the same layer, and a ground part having a second pattern in the form of an opening can be formed above the input and output lines. The first pattern of the ground part can include a second metal part positioned above the first output line and a third metal line positioned above the second output line. The third metal part can be electrically connected to the input line and spaced apart from the second metal part.

Thus, a potential difference can occur between the second and third metal parts. Although first and second output lines each have a length shorter than ¼ of an input wavelength λ, a difference between phases of first and second output signals can be about 180°. As a result, a whole size of the balun can be reduced.

Also, a whole capacitance value of the balun can be adjusted using a capacitor formed above the ground part. Thus, a mean frequency of the balun can decrease with an increase in a magnitude of the capacitor. As a result, the whole size of the balun can be reduced.

Also, the inductance of the balun can be increased and the range of matching frequency can be extended, by adjusting the size of the second pattern of the ground part, while the overall size of the balun can be made compact because the ground part is formed in a stack structure to increase the size of the second pattern.

The foregoing embodiments and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. A balance-to-unbalance (balun) comprising:

a substrate;

a first signal line formed on the substrate and transmitting an input signal;

a second signal line formed on a layer of the substrate on which the first signal line is formed, receiving the input signal from the first signal line, and outputting first and second output signals having different phases;

a ground part formed on a different layer from the layer on which the first and second signal lines are formed, comprising an opening, and electrically connected to the first signal line, wherein a portion of the ground part is removed to form the opening so that a potential difference occurs between a path of the second signal line through which the first output signal is transmitted and a path of the second signal line through which the second output signal is transmitted; and a first dielectric layer interposed between the first and second signal lines and the ground part.

2. The balun of claim 1, wherein the first signal line comprises:

a first port receiving the input signal from an external source; and a second port opposite to the first port and outputting the input signal received through the first port to the second signal line.

3. The balun of claim 2, further comprising a first conductor electrically connecting the first port to the ground part, wherein the dielectric layer comprises a first via hole, wherein a portion of the first dielectric layer is removed to form the first via hole in an area in which the second port and the ground part overlap with each other, and the first conductor is electrically connected to the first port and the ground part through the first via hole.

4. The balun of claim 3, wherein the ground part comprises:

a first metal part positioned in an edge area of the substrate and having a closed-loop shape;

a second metal part extending from the first metal part and facing the first and second signal lines; and a third metal part extending from the first metal part, spaced apart from the second metal part in an area facing the first port and an input port, and facing the first signal line.

5. The balun of claim 4, wherein the second metal part is electrically connected to the second port through the first conductor.

6. The balun of claim 4, wherein the second metal part and the third metal part comprise one or more branches which extend from the first metal part.

7. The balun of claim 3, wherein the ground part comprises:

a first ground part electrically connected with the second port via the first conductor;

a second ground part formed on the first ground part with a predetermined gap between the first and second ground parts; and a conductive member electrically connecting the first and the second ground parts, and supporting one end of the second ground part, the other end of the second ground part extending above the first ground part by a predetermined gap.

8. The balun of claim 2, wherein a width of an area of the first signal line in which the first port is formed is thicker than a width of an other area of the first signal line in which the first port is not formed.

9. The balun of claim 2, wherein the second signal line comprises:

an input port positioned adjacent to the second port and receiving the input signal;

a first output line extending from the input port, positioned adjacent to the first signal line, and outputting the first output signal; and a second output line extending from the input port in an opposite direction to a direction toward which the first output line extends and outputting the second output signal.

10. The balun of claim 9, wherein the input port is positioned in a center of the second signal line.

11. The balun of claim 9, wherein a length of the first signal line is equal to a sum of the lengths of the input port and the first output line.

12. The balun of claim 1, wherein a difference between phases of the first and second output signals is about 180°.

13. The balun of claim 1, further comprising at least one capacitor provided above the ground part and electrically connected to the ground part.

14. The balun of claim 13, wherein the at least one capacitor comprises:

a first electrode part provided in a first area and a second area above the ground part and electrically connected to the ground part in the second area; and a second electrode part provided above the first electrode part and electrically connected to the ground part in the first area.

15. The balun of claim 14, further comprising:

a second dielectric layer interposed between the ground part and the first electrode part; and a third dielectric layer interposed between the first and second electrode parts.

16. The balun of claim 15, wherein:

the second dielectric layer comprises a second via hole, wherein a portion of the second dielectric layer is removed to form the second via hole so as to expose a portion of the ground part in the second area;

the third dielectric layer comprises a third via hole, wherein a portion of the third dielectric layer is removed to form the third via hole so as to expose a portion of the ground part in the first area; and the first electrode part is electrically connected to the ground part through the second via hole, and the second electrode part is electrically connected to the ground part through the third via hole.

17. The balun of claim 16, further comprising:

a second conductor formed in the second via hole to electrically connect the first electrode part to the ground part; and a third conductor formed in the third via hole to electrically connect the second electrode part to the ground part.

18. The balun of claim 17, wherein an area of the first electrode part corresponding to the third conductor is removed, and the first electrode part is insulated from the third conductor.

19. The balun of claim 14, wherein the at least one capacitor further comprises:

a third electrode part formed in the first and second areas above the ground part; and a fourth electrode part extending from the third electrode part in a direction orthogonal to the third electrode part, positioned in the first area, and connected to the ground part to electrically connect the ground part to the third electrode part.

20. The balun of claim 19, wherein the fourth electrode part forms a single body along with the third electrode part.

21. The balun of claim 20, further comprising a fourth dielectric interposed between the third electrode part and the ground part.

22. A balun comprising:

a substrate;

a first signal line comprising first and second ports and formed on the substrate to transmit an input signal, wherein the first port is formed at a first end to receive the input signal, and the second port is formed at a second end opposite to the first port to output the input signal received from the first port;

a second signal line positioned adjacent to the first signal line on the substrate, crossing a center of the substrate, and comprising an output port at either end and an input port, wherein the input port is formed in an area adjacent to the second port to receive the input signal from the second port, and both ends of the second signal line output first and second output signals corresponding to the input signal and having different phases;

a ground part positioned in an edge area of the substrate and comprising first, second, and third metal parts, wherein the first metal part has a closed-loop shape, the second metal part extends from the first metal part toward the center of the substrate and faces the first and second signal lines, and the third metal part extends from the first metal part toward the center of the substrate, faces the second signal line, is spaced apart from the second metal part in an area in which the input port and the second port are formed, and is electrically connected to the second port; and a dielectric interposed between the first and second signal lines and the ground part.

23. A balun comprising:

a substrate;

a first signal line comprising first and second ports and formed on the substrate to transmit an input signal, wherein the first port is formed at a first end to receive the input signal, and the second port is formed at a second end opposite to the first end to output the input signal received from the first port and;

a second signal line positioned adjacent to the first signal line on the substrate, crossing a center of the substrate, and comprising an output port at either end and an input port formed in an area adjacent to the second port to receive the input signal from the second port, and both ends of the second signal line output first and second output signals corresponding to the input signal and having different phases;

a ground part positioned in an edge area of the substrate and comprising first, second, and third metal parts, wherein the first metal part has a closed-loop shape, the second metal part extends from the first metal part toward the center of the substrate and faces the first and second signal lines, and the third metal part extends from the first metal part toward the center of the substrate, faces the second signal line, is spaced from the second metal part in an area in which the input port and the second port are formed, and is electrically connected to the second port;

a dielectric interposed between the first and second signal lines and the ground part; and a capacitor provided above the ground part and comprising first and second electrode parts, wherein the first electrode part is electrically connected to the third metal part, and the second electrode part is spaced apart from the first electrode part above the first electrode part and electrically connected to the second metal part.

24. A balun comprising:

a substrate;

a first signal line comprising first and second ports and formed on the substrate to transmit an input signal, wherein the first port is formed at a first end to receive the input signal, and the second port is formed at a second end opposite to the first end to output the input signal received from the first port;

a second signal line positioned adjacent to the first signal line on the substrate, crossing a center of the substrate, and comprising an output port at either end and an input port formed in an area adjacent to the second port to receive the input signal from the second port, and both ends of the second signal line output first and second output signals corresponding to the input signal and having different phases;

a ground part positioned in an edge area of the substrate and comprising first, second, and third metal parts, wherein the first metal part has a closed-loop shape, the second metal part extends from the first metal part toward the center of the substrate and faces the first and second signal lines, and the third metal part extends from the first metal part toward the center of the substrate, faces the second signal line, is spaced from the second metal part in an area in which the input port and the second port are formed, and is electrically connected to the second port;

a dielectric interposed between the first and second signal lines and the ground part; and a capacitor provided above the ground part and comprising third and fourth electrode parts, wherein the third electrode part is spaced apart from the third metal part, and the fourth electrode part extends from the third electrode part and is connected to the second metal part to electrically connect the second metal port to the third electrode part.

* * * * *